United States Patent
Hollmer et al.

(10) Patent No.: US 6,181,605 B1
(45) Date of Patent: Jan. 30, 2001

(54) GLOBAL ERASE/PROGRAM VERIFICATION APPARATUS AND METHOD

(75) Inventors: Shane C. Hollmer, San Jose; Joseph G. Pawletko, Santa Clara; Michael S. C. Chung, San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/414,750

(22) Filed: Oct. 6, 1999

(51) Int. Cl.[7] .................................................. G11C 16/06
(52) U.S. Cl. .............................. 365/185.22; 365/185.21; 365/185.29
(58) Field of Search ..................... 365/185.21, 185.22, 365/185.17, 185.18, 185.29

(56) References Cited

U.S. PATENT DOCUMENTS

| | | | |
|---|---|---|---|
| 5,936,890 | * 8/1999 | Yeom | 365/185.22 |
| 6,009,014 | * 12/1999 | Hollmer et al. | 365/185.22 |
| 6,009,015 | * 12/1999 | Sugiyama | 365/185.22 |
| 6,055,188 | * 4/2000 | Takeuchi et al. | 365/185.22 |
| 6,055,189 | * 4/2000 | Ogane | 365/185.22 |

\* cited by examiner

*Primary Examiner*—Son Mai
(74) *Attorney, Agent, or Firm*—Skjerven Morrill MacPherson LLP; Edward C. Kwok; David C. Hsia

(57) ABSTRACT

A technique to determine whether multiple memory cells are programmed or erased. After a program or erase operation, respective program or erase verify operations are performed. A logical gate is coupled to measure the state of each memory cell. When all memory cells selected to be programmed or erased are programmed or erased then the output of the logical gate indicates successful program or erase verify. Thus, by using a single logical gate coupled to measure the states of multiple memory cells, only the output of the logical gate need be measured to determine successful program or erase verification of multiple memory cells.

4 Claims, 4 Drawing Sheets

GLOBAL ERASE/PROGRAM VERIFICATION APPARATUS AND METHOD

FIELD OF THE INVENTION

The present invention is directed to a memory system and more particularly to an apparatus and method to verify whether multiple memory cells have successfully programmed or erased.

RELATED ART

FIG. 1 illustrates a cross sectional view of a conventional memory transistor, also known as a memory cell. The memory transistor includes a control gate CG, a floating gate FG, a drain D, a source S, and a well W. Thin oxide layers isolate the floating gate FG from the control gate CG as well as the well W.

FIG. 2 schematically illustrates a conventional NAND type flash memory array 100 that includes numerous memory cells, each depicted in FIG. 1. A "string" includes a selection transistor $T_{i-1}$, memory transistors $M_{i-1}$ to $M_{i-j}$, and a selection transistor $T_{i-2}$, all being serially coupled. Each string can be coupled to a bit line BLj and a common source CS through selection transistors $T_{i-1}$ and $T_{i-2}$, respectively. The control gates for selection transistors $T_{i-1}$ and $T_{i-2}$ are respectively connected to selection lines $Sl_1$ and $Sl_2$. The control gates for the memory transistors $M_{i-1}$ to $M_{i-j}$ are respectively connected to word lines $W_1$ to $W_j$. Typically, a read operation is performed on a page basis, i.e., flash memory cells coupled to a word line are read together.

Herein, a memory transistor represents logical LOW when it is programmed to have a threshold voltage that is larger than a predetermined minimum threshold voltage for logical LOW bits. Correspondingly, a memory transistor represents a logical HIGH when it is erased to have a threshold voltage that is less than a predetermined maximum threshold voltage for logical HIGH bits. One skilled in the art will understand that logic level assignments to the predetermined minimum and maximum threshold voltages are arbitrary.

During testing of memory cells and subsequent consumer use of memory cells, it is desirable to speed the time to determine the success of both program and erase operations. Thus what is needed is a method and apparatus to verify successful program and erase operations.

SUMMARY

An embodiment of the present invention includes a verification circuit that determines whether a plurality of memory cells are programmed, where each memory cell has an associated data latch that identifies whether the cell is to be programmed, the verification circuit including a plurality of switches, each switch being coupled to a data latch, where each switch is controlled by the state of the associated data latch, where if all memory cells identified to be programmed are programmed, the state of all switches are the same.

An embodiment of the present invention includes a verification circuit that determines whether a plurality of memory cells are erased, the verification circuit including a plurality of switches, each switch being coupled to measure the state of an associated memory cell, where the state of all switches are the same if all memory cells are erased.

Advantageously, only a single output needs to be measured in a program or erase verification thereby decreasing the time needed to erase or program verify.

Various embodiments of the present invention will be more fully understood in light of the following detailed description taken together with the accompanying drawings.

BRIEF DESCRIPTION OF THE DRAWINGS

Note that use of the same reference numbers in different figures indicates the same or like elements.

DETAILED DESCRIPTION

Overview

Figure 1:
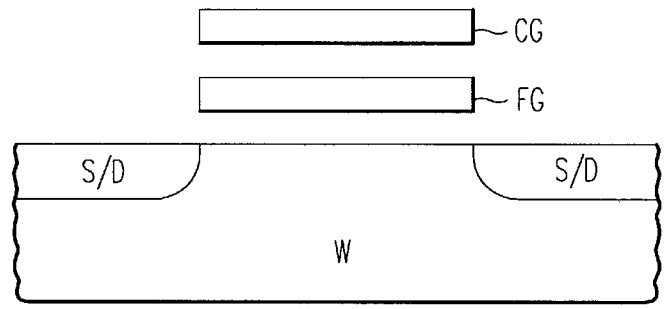
FIG. 1 illustrates a cross sectional view of a conventional memory transistor.
Figure 3:
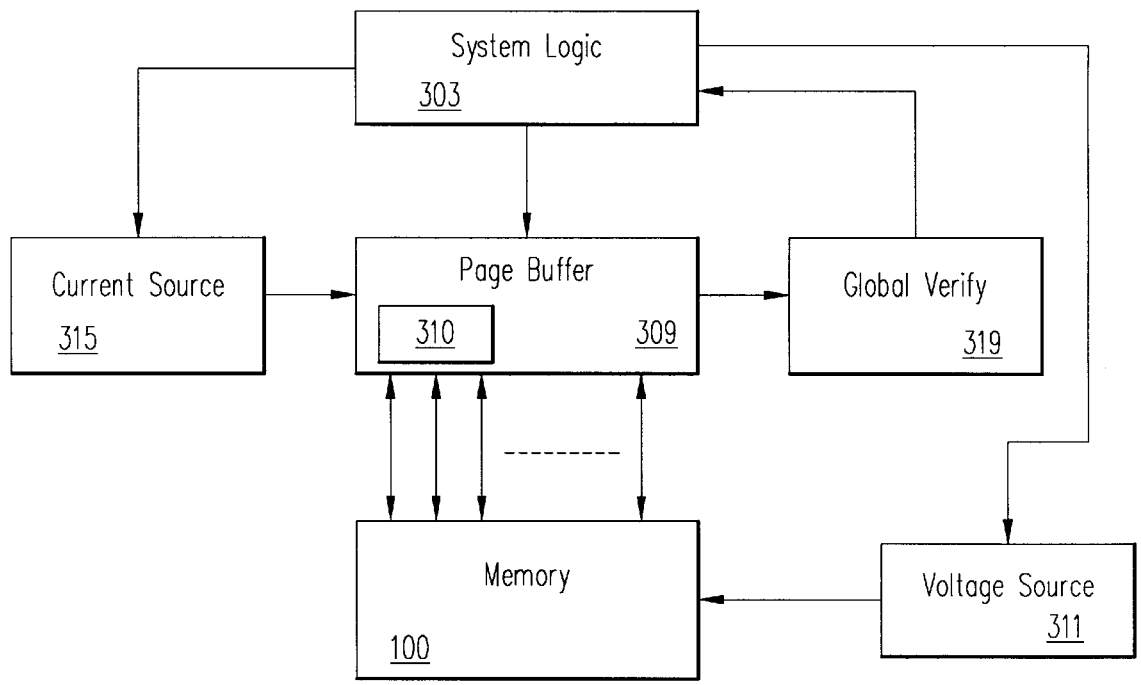
FIG. 3 schematically depicts a memory system 300 in accordance with an embodiment of the present invention.
Figure 2:
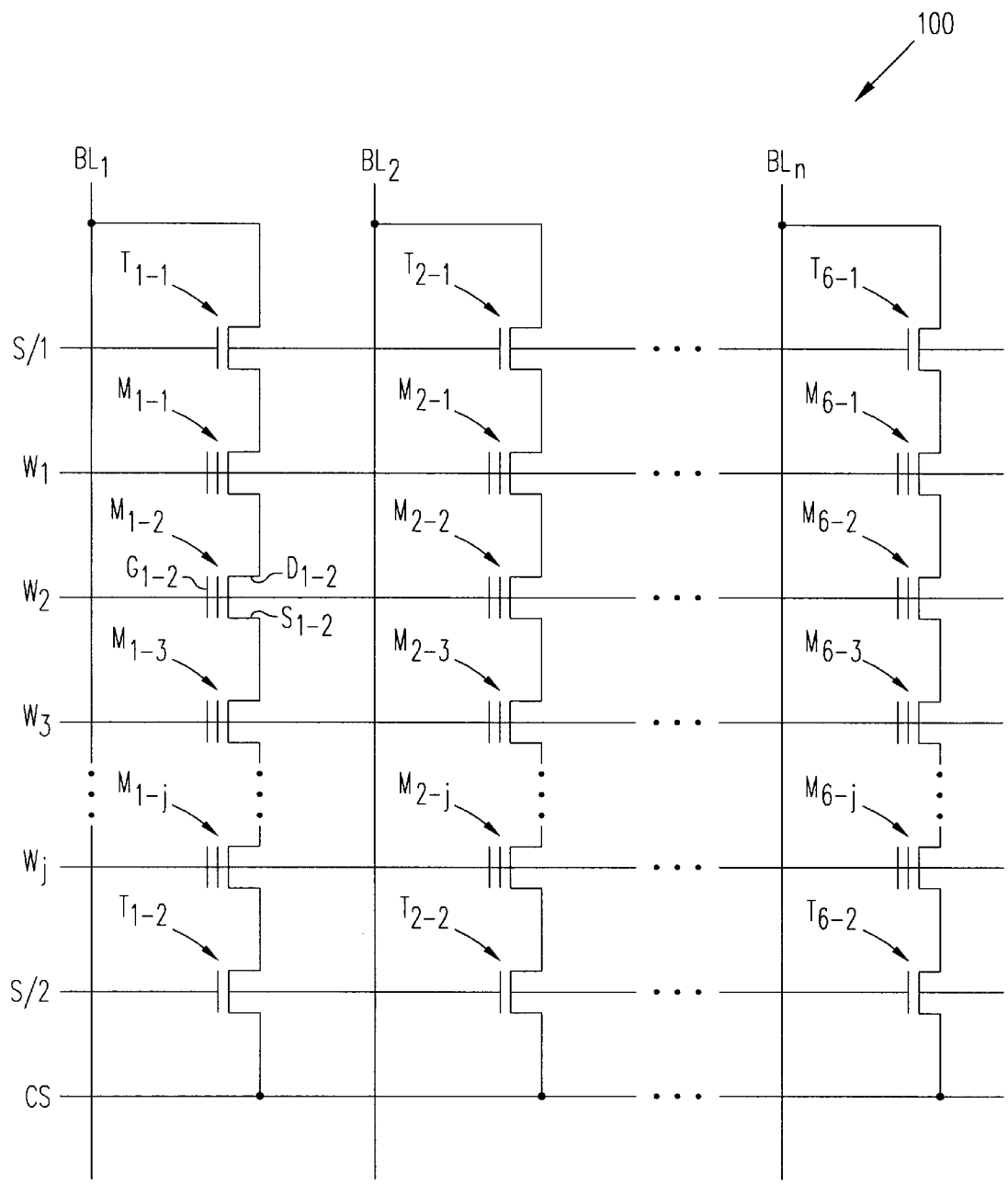
FIG. 2 Schematically illustrates a conventional NAND type flash memory array 100.

FIG. 3 schematically depicts a memory system 300 in accordance with an embodiment of the present invention. Memory system 300 includes a system logic 303 that controls the operation of memory system 300; a conventional memory array 100, described earlier; a conventional voltage source 311 used to generate voltages to appropriate portions of memory array 100 during conventional programming and erase operations; a page buffer 309 that is used to identify and/or set the state of memory cells; a current source 315 that generates a reference current through selected bitlines of memory array 100; and a global verify device 319 that determines whether multiple memory cells have successfully programmed or erased.

Following conventional program and erase operations, current source 315 provides reference currents through bit lines of memory array 100 which are associated with memory cells selected to be programmed or erased. The global verify device 319 determines whether the selected memory cells have successfully programmed or erased.

System Logic 303

In this embodiment, system logic 303 is implemented in hard wired logic. Of course, system logic 303 could be implemented in software executed by a microprocessor.

Voltage Source 311

Techniques to program and erase memory cells are well known. See for example, U.S. Pat. No. 5,812,457, entitled "Semiconductor NAND type flash memory with incremental step pulse programming", to inventors Arase et al., which is incorporated herein by reference in its entirety.

Of course, though not depicted, conventional X and Y address decoders are used. For an exemplary X-decoder, see U.S. Pat. No. 5,852,576, entitled "High voltage NMOS pass gate for integrated circuit with high voltage generator and flash non-volatile memory device having the pass gate", inventors Le et al. and U.S. Pat. No. 5,844,840, entitled "High voltage NMOS pass gate having supply range, area, and speed advantages", inventors Le et al., which are incorporated herein by reference in their entirety.

Page Buffer 309

Figure 4:
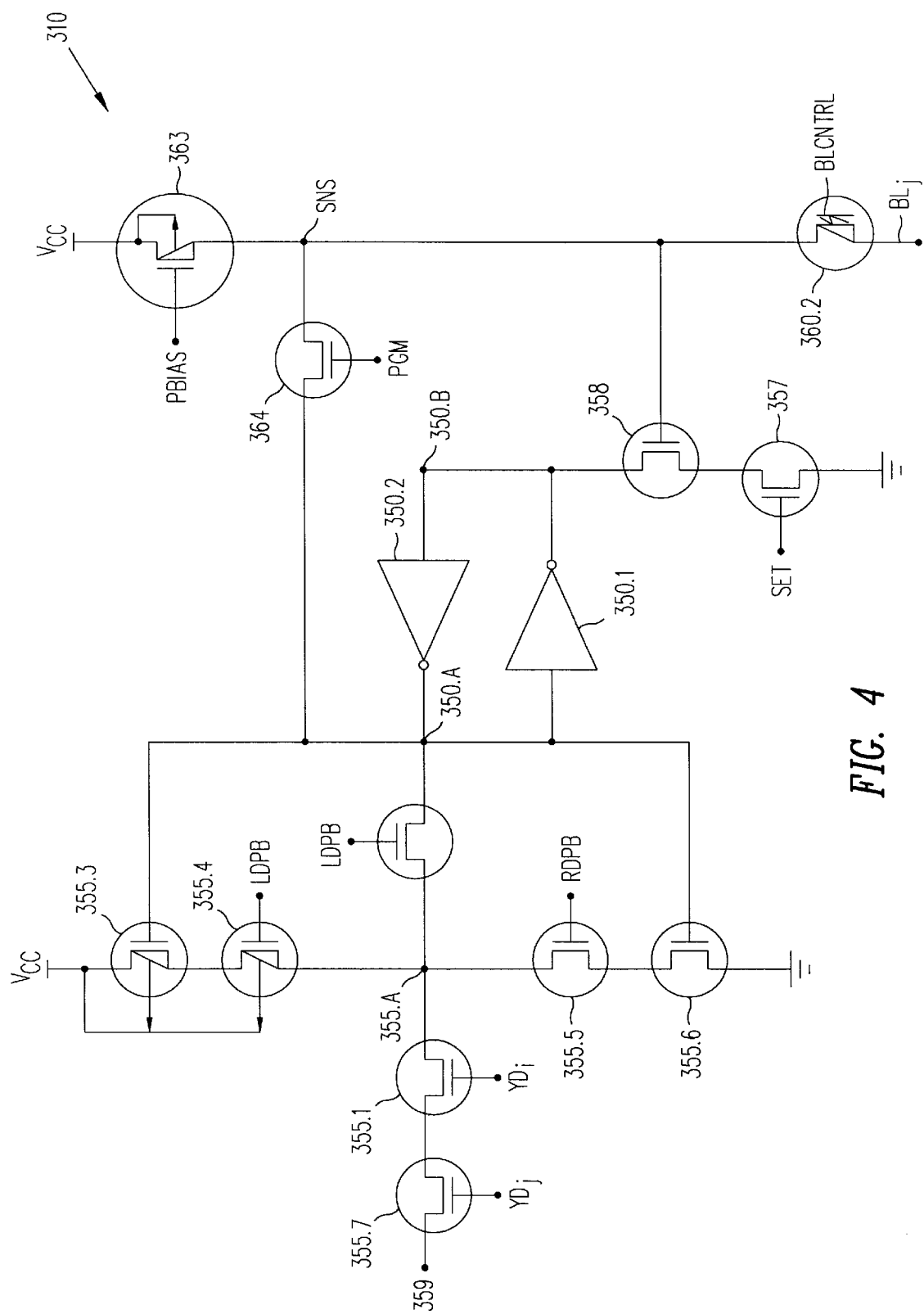
FIG. 4 schematically depicts a suitable implementation of latch and sensing circuitry 310 for each bit in the page buffer 309.

Each bit line, BLj, of memory array 100 is coupled to page buffer 309. FIG. 4 schematically depicts a suitable implementation of latch and sensing circuitry 310 for each bit in the page buffer 309.

Conventional data latch includes inverter 350.1 coupled to an inverter 350.2. Outputs of inverters 350.1 and 350.2 are coupled to respective nodes 350.B and 350.A.

In one embodiment, load circuitry is used to specify which bits are to be programmed. Load circuitry includes NMOS transistors 355.2, 355.5, and 355.6 and PMOS transistors 355.3 and 355.4.

Transistors 355.2, 355.3, and 355.4 together allow a load operation of node 350.A when signal LDPB is HIGH. Transistor 355.2 passes the voltage present at node 355.A to node 350.A when LDPB is logical HIGH.

Transistors 355.3, 355.4, 355.5, and 355.6 together allow a read operation when signal RDPB is HIGH. Transistor 355.5 allows transistor 355.6 to control node 355.A when RDPB is logical HIGH and node 350.A is logical HIGH.

In this embodiment, transistors 355.1 and 355.7 selectively couple node 359 to node 355.A. When a HIGH signal is provided to each of the gate terminals of transistors 355.1 and 355.7, the signal at node 359 is transferred to node 355.A or vice versa. A conventional address decoder provides inputs of YDi and YDj to gate terminals of respective transistors 355.1 and 355.7.

Transistors 357 and 358 are arranged so that if SNS node is HIGH when the signal SET is HIGH, node 350.B will be pulled to ground. This will cause a logical LOW to be stored on node 350.B and a logical HIGH to be stored on node 350.A.

NMOS transistor 364 passes the voltage stored on node 350.A to SNS node of bit line BLj when signal PGM is a HIGH.

Bit line BLj includes low threshold NMOS transistor 360.2 and PMOS transistor 363. During sensing of the state of a memory cell connected to bit line BLj, the transistor 360.2 is used as a cascode device to amplify the bit line voltage. When the voltage bit line Blj approaches the BLCNTRL voltage, transistor 360.2 begins to turn off. This allows transistor 363 to pull the SNS node toward Vcc, thereby turning on transistor 358.

N-well and source terminals of p-channel transistor 363 are coupled to terminal Vcc. Input PBIAS to transistor 363 controls the level of reference current that flows through bit line BLj.

Reference Current Source 315

One technique to detect whether selected memory cells are programmed/erased is to use a conventional current source to provide a reference current, Iref, to the bit line BLj of each latch and sensing circuitry 310 associated with selected memory cells. The relationship between the reference current and program/erase verification is described in more detail later.

Program/Erase Verification

In accordance with one embodiment of the present invention, an apparatus and method are provided to verify program and erase operations across multiple latch and sensing circuitry 310. In this embodiment, the operation of program and erase verification circuits is similar to a NOR logic circuit.

For program verification, inputs to the NOR logical circuit are from node 350.B (FIG. 4) of each latch and sensing circuitry 310. In this embodiment, the node 350.A of only programmed cells is set to logical LOW, which corresponds to node 350.B being a logical HIGH state. For cells that are not to be programmed, the node 350.A is set to logical HIGH, which corresponds to node 350.B being a logical LOW state. After a reference current is generated through each bit line that includes a programmed cell on the selected page, for each bit line that includes a programmed cell, the node 350.B switches to a logical LOW. Thus the output of NOR is a HIGH when the state of each node 350.B is LOW, thereby indicating a program verify.

For erase verification, inputs to the NOR logic circuit are from node 350.A of each latch and sensing circuitry 310. When a node 350.A is a logical HIGH state, the corresponding memory cell is not erased. Erase verification occurs when all nodes 350.A are a LOW state. Thus an output of HIGH from the NOR logic circuit indicates erase verification.

Figure 5:
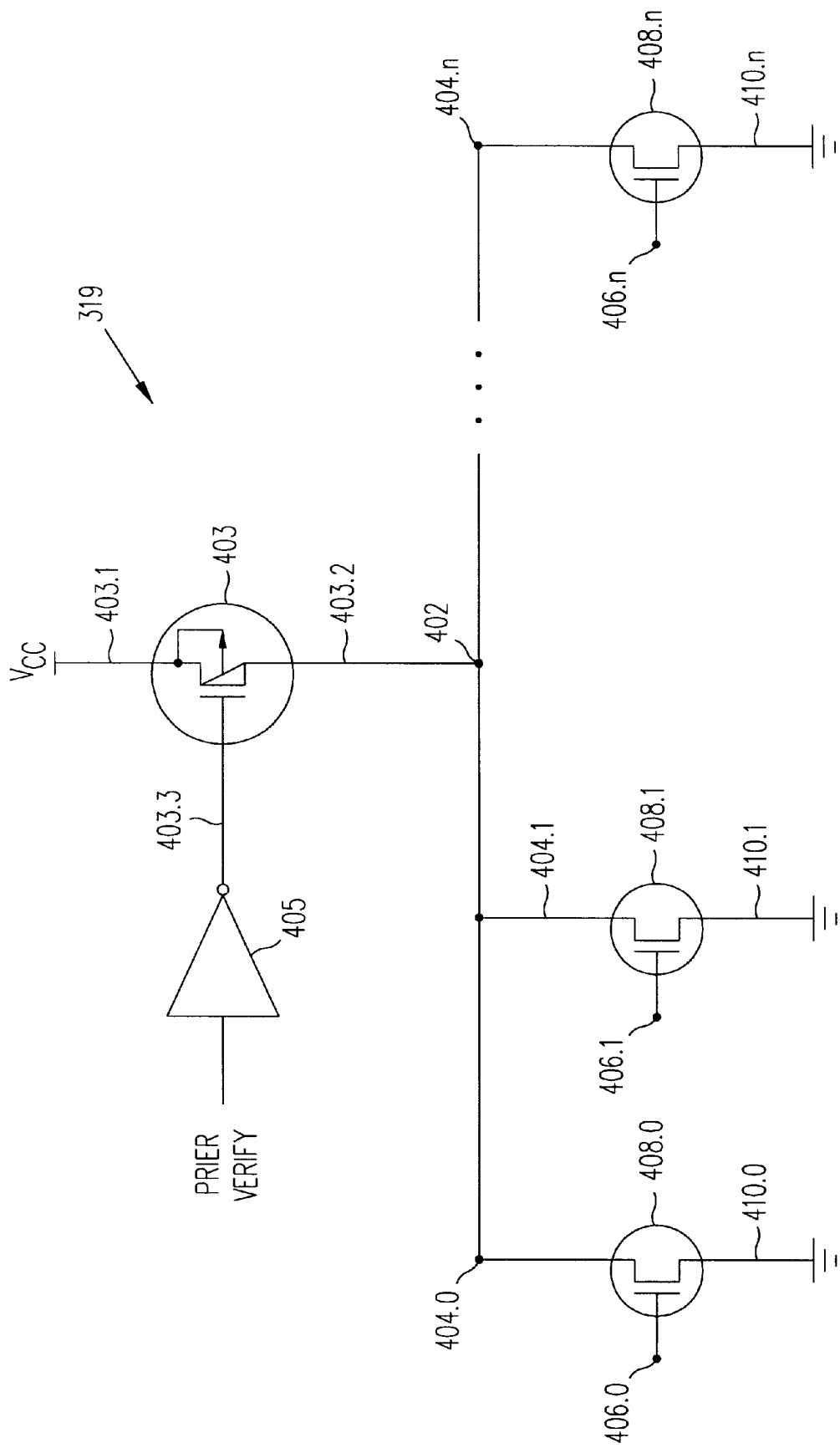
FIG. 5 depicts a suitable implementation of verification device 319, in accordance with one embodiment of the present invention.

FIG. 5 depicts suitable implementations of each of program and erase verification circuits in verification device 319. In one embodiment, separate replicas of verification device 319 are used for program and erase verifications.

Verification device 319 includes NMOS transistors 408.0 to 408.n, PMOS transistor 403, and inverter 405. In this embodiment, each of the source terminals 404.0 to 404.n of respective transistors 408.0 to 408.n are coupled to terminal 402. Drain terminals 410.0 to 410.n of respective transistors 408.0 to 408.n are coupled to ground. Terminal 402 is coupled to the drain terminal 403.2 of PMOS transistor 403. PMOS transistor 403 is a "weak p-channel" and thus is sensitive to any gate terminal 406.j being a logical HIGH. Source terminal 403.1 and gate terminal 403.3 of transistor 403 are coupled to respective terminal Vcc and inverter 405. A signal from system logic 303 is input to inverter 405 and controls whether transistor 403 turns on.

For program verification, node 350.B (FIG. 4) of each latch and sensing circuitry 310 is coupled to gate terminal 406.j, where j=0 to n. In a program operation, discussed earlier, latches of cells that are to be programmed are set to a HIGH at node 350.B. Following an attempt to program a cell, the cell is programmed if the latch switches to a LOW state at node 350.B. Thus when all nodes 350.B are a LOW state, each gate terminal 406.j, where j=0 to n, is a logical LOW state, e.g., approximately 0 V. Consequently, each of source terminals 404.0 to 404.n is in a HIGH state and thus terminal 402 is in a HIGH state. However, when any gate terminal 406.j is a logical HIGH state, i.e., corresponding to a latch that is not program verified, terminal 402 is a logical LOW. Thus a successful program verification occurs when terminal 402 is a HIGH.

For erase verification, node 350.A of each latch and sensing circuitry 310 (FIG. 4) is coupled to gate terminal 406.j, where j=0 to n. In an erase operation, discussed earlier, latches of all cells are set LOW at node 350.A. Following an attempt to erase a cell, the cell is erased if the latch remains at LOW at node 350.A. Thus when all nodes are a LOW state, gate terminals are a logical LOW state, e.g., approximately 0 V. Consequently, each of source terminals 404.0 to 404.n is in a LOW state and thus terminal 402 is in a LOW state. However, when any gate terminal 406.j is not a logical LOW state, i.e., corresponding to a latch that is not erase verified, terminal 402 is logical HIGH. Thus a successful erase verification occurs when terminal 402 is a LOW.

Thus by use of separate verification circuits 319, erase and program verification across an entire word line can be verified by measuring a single line terminal. Significant time savings thus result over inspecting each bit in the page buffers to determine whether program/erase has occurred. During test mode, in which a fabricated memory device is tested to determine program and erase characteristics, use of the verification device 319 speeds time to determine program and erase characteristics. Consequently, test times of commercially suppliable memory devices decreases, thereby increasing production capacity without need for additional capital equipment. This results in lower overall product cost.

Modifications

The above-described embodiments of the present invention are illustrative and not limiting. It will thus be obvious to those skilled in the art that various changes and modifications may be made without departing from this invention in its broader aspects. For example, memory array 100 can be a NOR type. Therefore, the appended claims encompass all such changes and modifications as fall within the true spirit and scope of this invention.

What is claimed is:

1. A memory system comprising:

a plurality of memory cells;

a plurality of latch devices, wherein each latch device corresponds to one of said memory cell, holding a value indicating whether or not said corresponding memory cell is to be programmed;

a voltage source that selectively programs the memory cells to be programmed; and a verification circuit comprising a plurality of switches configured as a NOR circuit, each of said switches being coupled to receive as input said value held in a corresponding one of said the latch devices.

2. The system of claim 1, wherein (a) each of the plurality of latch devices is coupled to receive, after said programming by said voltage source, a stored value of the corresponding memory cell, (b) each of the plurality of latches is set to hold a predetermined value prior to programming of said memory cells by said voltage source, and (c) when all of the selected memory cells are successfully programmed, said values held in the plurality of latch devices are the same.

3. The system of claim 2, further comprising a current source that provides current to said latch devices after said programming of said memory by said voltage source, wherein when the memory cell corresponding to one of said latch devices is programmed, said latch device changes state in response to said current.

4. The system as in claim 1, wherein said verification circuit further comprising a second plurality of switches configured as a second NOR circuit, each of said second plurality of switches corresponding to one of said plurality of latch devices and being coupled to receive as input a value which is a logical complement of said value held in said corresponding latch device.

* * * * *